US011829177B2

(12) United States Patent
Chattu et al.

(10) Patent No.: US 11,829,177 B2
(45) Date of Patent: Nov. 28, 2023

(54) SYSTEMS AND METHODS FOR INITIALIZING BANDGAP CIRCUITS

(71) Applicant: Micron Technology, Inc., Boise, ID (US)

(72) Inventors: Suresh Chattu, Hyderabad (IN); Wei Lu Chu, Shanghai (CN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 261 days.

(21) Appl. No.: 17/391,655

(22) Filed: Aug. 2, 2021

(65) Prior Publication Data
US 2023/0034057 A1 Feb. 2, 2023

(51) Int. Cl.
*G11C 11/4074* (2006.01)
*G05F 3/26* (2006.01)
*G05F 1/575* (2006.01)

(52) U.S. Cl.
CPC .............. *G05F 3/262* (2013.01); *G05F 1/575* (2013.01); *G11C 11/4074* (2013.01)

(58) Field of Classification Search
CPC .................................................. G11C 11/4074
USPC ........................................................ 365/226
See application file for complete search history.

(56) References Cited

U.S. PATENT DOCUMENTS

| 6,677,808 B1 * | 1/2004 | Sean ......................... G05F 3/30 327/542 |
| 6,784,652 B1 | 8/2004 | Aude |
| 2021/0242772 A1 * | 8/2021 | Nomura ................ H02M 3/155 |

* cited by examiner

*Primary Examiner* — Anthan Tran
(74) *Attorney, Agent, or Firm* — Fletcher Yoder, P.C.

(57) ABSTRACT

A semiconductor device may include a bandgap circuit that outputs a reference voltage. The bandgap circuit may include a bandgap core circuit and a startup circuit coupled to the bandgap core circuit. The startup circuit may connect a voltage source to a node that corresponds to an output of the bandgap core circuit in response to the bandgap core circuit being initialized. The startup circuit may also disconnect the voltage source from the node in response to the output voltage being equal to or greater than a desired voltage (e.g., a threshold voltage) and one or more local voltages of the bandgap core circuit being equal to or greater than a local threshold voltage.

20 Claims, 3 Drawing Sheets

SYSTEMS AND METHODS FOR INITIALIZING BANDGAP CIRCUITS

BACKGROUND

Field of the Present Disclosure

Embodiments of the present disclosure relate generally to the field of bandgap circuits. More specifically, embodiments of the present disclosure relate to startup circuits used to initialize bandgap circuits.

Description of Related Art

Electronic devices, such as semiconductor devices, memory chips, microprocessor chips, image chips, and the like, may use a reference voltage to perform various tasks and operations. For example, reference voltages are used to provide consistent power supplies and current supplies, such that a corresponding electronic device (e.g., memory device) may accurately perform its operation. As such, bandgap reference circuits may be incorporated with an electronic device to provide reference voltages due to their ability to maintain stable output voltages. When initializing a bandgap reference circuit, a startup circuit may be employed to enable the bandgap reference circuit to ramp its output voltage to some value, after which the bandgap reference circuit may be able to maintain a constant reference voltage output. As circuit components (e.g., switches) of the bandgap reference circuits and startup circuits are susceptible to different variables, such as variations in process, voltage, and temperature, bandgap reference circuits may provide different reference voltages based on such variables. Such variations in behavior of the bandgap reference circuits are undesirable. With this in mind, it is desirable to provide improved systems and methods for initializing bandgap reference circuits.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Certain semiconductor devices (e.g., memory devices) may use bandgap circuits to provide a constant reference voltage, thereby enabling the semiconductor devices to perform their operations accurately. Generally, the bandgap circuit outputs a voltage ($V_{bgr}$) that stabilizes at some voltage level, such that the output voltage $V_{bgr}$ is fixed (e.g., constant) regardless of power supply variations, temperature changes, various circuit loads, and the like. The bandgap circuit may include a bandgap core circuit and a startup circuit. Moreover, the bandgap circuit may operate at an initial state or an operational state, as will be appreciated.

Prior to the bandgap circuit outputting a stable output voltage $V_{bgr}$, the startup circuit may be used to ramp the output voltage $V_{bgr}$ of the bandgap core circuit up until the bandgap circuit reaches an operational state (e.g., the output voltage $V_{bgr}$ reaches a desired voltage value). Moreover, ramping up the output voltage $V_{bgr}$ of the bandgap core circuit to the desired voltage value (e.g., a threshold voltage) may enable the bandgap circuit to operate at a stable state during the operational state. That is, the bandgap circuit may operate at the operational state, where the output voltage $V_{bgr}$ is a constant voltage (e.g., 1.25 volts), and at the initial state where the bandgap circuit does not output a voltage.

With this in mind, the startup circuit may assist the bandgap core circuit to initialize itself while the bandgap core circuit is ramping up its power. However, if the startup circuit does not ramp up the power of the bandgap core circuit in an expected manner, the bandgap core circuit may not operate accurately. That is, if the bandgap circuit cannot startup correctly, it may output a reference voltage $V_{bgr}$ that may not match an expected desired voltage value to be received by other circuit components, thereby causing the corresponding electronic device to operate inefficiently or incorrectly.

In certain instances, the startup circuit may not operate consistently across various process, voltage, temperature (PVT) corners or values, thereby causing the bandgap core circuit to start up incorrectly. In particular, as the process variation for circuit components in the startup circuit and the bandgap core circuit varies, the startup circuit may not consistently cause the bandgap core circuit to ramp up its voltage to the operational state. With this in mind, the embodiments described herein include a startup circuit that operates more consistently, across a broader range of PVT corners, in conjunction with the bandgap core circuit.

In one embodiment, the startup circuit may include a comparator circuit and a current mirror circuit to cause the bandgap circuit to operate in the operational state. The comparator circuit may include a replica (or a scaled down replica) of an amplifier circuit (e.g., differential op-amp circuit) used in the bandgap core circuit. The replica design of the startup circuit may allow the startup circuit to mimic the operation of the bandgap core circuit, based on receiving first and second local voltages $V_{be}$ of the bandgap core circuit. As such, the replica design may enable the bandgap core circuit and the startup circuit to operate in conjunction with each other. The current mirror circuit may include a feedback circuit coupled to the output voltage $V_{bgr}$ of the bandgap core circuit to further enable the two circuits to operate in conjunction with each other. Moreover, the startup circuit may include a switch that may couple a voltage source VDD to the bandgap circuit to ramp up the output voltage $V_{bgr}$ to the operational state based on output signals of the comparator unit and the current mirror.

In another embodiment, the startup circuit may include a feedback circuit, a comparator circuit, and a hysteresis circuit, integrated within a current mirror circuit to cause operation of the bandgap circuit in the operational state. The feedback circuit may couple to the output voltage $V_{bgr}$ of the bandgap core circuit and the comparator circuit may couple to at least one of the local voltages $V_{be}$ of the bandgap core circuit. The feedback circuit and the comparator may enable the bandgap core circuit and the startup circuit to operate in conjunction with each other.

In such embodiments, the current mirror may include a reference current branch, a second branch, and a third branch coupled to the hysteresis circuit. In specific embodiments, the second and third branches of the current mirror may each mirror a portion of (e.g., half, a quarter) a reference current of the reference current branch when ramping up the output voltage $V_{bgr}$. The feedback circuit and the comparator may each connect or disconnect the second branch and the third branch with a ground connection based on the output voltage $V_{bgr}$ and the local voltage $V_{be}$ of the bandgap core circuit. For example, the feedback circuit and the comparator may initially disconnect the second branch and the third branch from the ground connection to cause ramping up the output voltage $V_{bgr}$ in the bandgap core circuit. Subsequently, the feedback circuit and the comparator may connect the second branch and the third branch to the ground connection to cause disconnecting the startup circuit from the bandgap core circuit when the output voltage $V_{bgr}$ is ramped up to the desired voltage.

Moreover, the hysteresis circuit may connect or disconnect the third branch based on whether the startup circuit is ramping up the output voltage $V_{bgr}$ to the operational state or disconnected from the bandgap circuit. For example, the hysteresis circuit may disconnect the third branch from the startup circuit to reduce the current flow and undesired oscillations when the startup circuit is disconnected from the bandgap circuit. As such, the hysteresis circuit may reduce, for example, time delays and undesired oscillations within the startup circuit when connecting or disconnecting the startup circuit and the bandgap circuit.

That said, the startup circuit may also include a switch that may couple the voltage source VDD to the bandgap circuit to ramp up the output voltage $V_{bgr}$ to the operation state based on an output signal of the current mirror. In the embodiments described above, the startup circuit may provide a gate signal to the switch (e.g., a low voltage gate signal to a P-type switch) that may couple the voltage source VDD to a node of the bandgap core circuit that is coupled to the output voltage $V_{bgr}$. As such, the startup circuit may initialize the output voltage $V_{bgr}$ of the bandgap core circuit by ramping up its voltage. After the output voltage $V_{bgr}$ reaches a desired voltage value, the bandgap core circuit may operate without the assistance of the startup circuit providing a connection between the voltage source VDD and the output voltage $V_{bgr}$. As such, the startup circuit may be designed to disconnect (e.g., decouple) the voltage source VDD from the bandgap circuit after the output voltage $V_{bgr}$ reaches the desired voltage value. As mentioned above and described in more details below, the feedback circuit and the comparator circuit may disconnect the startup circuit from the bandgap core circuit when the output voltage $V_{bgr}$ reaches the desired voltage value.

The desired voltage value corresponds to an output voltage $V_{bgr}$ value that enables the bandgap core circuit to sustain the operational state. In additional or alternative embodiments, a high voltage gate signal may be provided to an N-type switch for coupling the voltage source VDD to the node coupled to the output voltage $V_{bgr}$ and thereby ramping up the output voltage $V_{bgr}$. In such embodiments, a low voltage gate signal may be provided to the N-type switch for disconnecting the voltage source VDD from the node coupled to the output voltage $V_{bgr}$ and thereby powering down the startup circuit.

Such startup circuits may mirror the variations in operation of the bandgap core circuit to disconnect from the bandgap core circuit (e.g., turn off) at an appropriate time and allow the bandgap core circuit to output the output voltage $V_{bgr}$ using the desired voltage value. Moreover, using the startup circuits described herein may cause the bandgap circuit to operate consistently across various ranges of process, voltage, and temperature conditions, while having a smaller design footprint. Additional details with regard to the startup circuits will be described below with reference to FIGS. 1-3.

Figure 1:
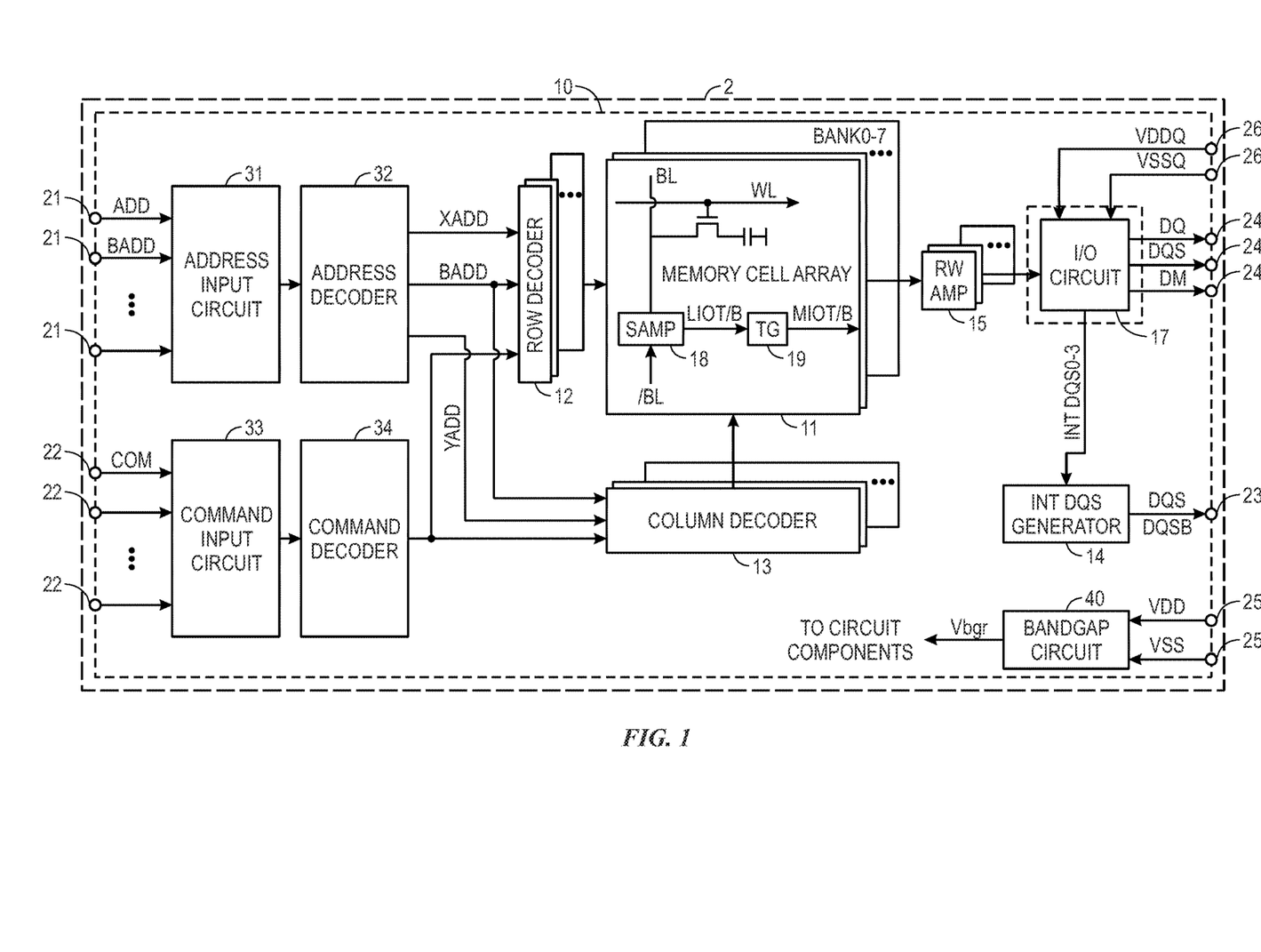
FIG. 1 is a simplified block diagram illustrating a semiconductor device that includes a bandgap circuit, according to an embodiment of the present disclosure.

Turning now to the figures, FIG. 1 is a block diagram of a semiconductor device in accordance with an embodiment of the present disclosure. That is, for example, the semiconductor device 10 may use a bandgap circuit to perform various operations. Although the following description of the semiconductor device and the bandgap circuit will be described in the context of a memory device, it should be noted that the embodiments described herein regarding the bandgap circuit may be employed for any suitable electronic device. Indeed, the description of the memory device below is provided to explain certain aspects of the bandgap circuit including the startup circuit of the present disclosure, and, as such, the embodiments described herein should not be limited to memory devices.

Referring now to FIG. 1, a semiconductor device 10 may be any suitable memory device, such as a low power double data rate type 4 (LPDDR4) synchronous dynamic random access memory (SDRAM) integrated into a single semiconductor chip, for example. The semiconductor device 10 may be mounted on an external substrate 2 that is a memory module substrate, a mother board or the like. The semiconductor device 10 may include a plurality of memory banks each having a plurality of memory cell arrays 11. Each memory cell array 11 may include a plurality of word lines WL, a plurality of bit lines BL, and a plurality of memory cells MC arranged at intersections of the plurality of word lines WL and the plurality of bit lines BL. The selection of the word line WL is performed by a row decoder 12 and the selection of the bit line BL is performed by a column decoder 13. Sense amplifiers 18 are coupled to corresponding bit lines BL and connected to local input/output (I/O) line pairs LIOT/B. Local IO line pairs LIOT/B are connected to main IO line pairs MIOT/B via transfer gates TG 19 which function as switches.

Turning to the explanation of a plurality of external terminals included in the semiconductor device 10, the plurality of external terminals includes address terminals 21, command terminals 22, data strobe (DOS) terminals 23, data (DO) terminals 24 and power supply terminals 25 and 26. The data terminals 24 may be coupled to output buffers for read operations of memories. Alternatively, the data terminals 24 may be coupled to input buffers for read/write access of the memories.

The address terminals 21 are supplied with an address signal ADD and a bank address signal BADD. The address signal ADD and the bank address signal BADD supplied to the address terminals 21 are transferred via an address input circuit 31 to an address decoder 32. The address decoder 32 receives the address signal ADD and supplies a decoded row address signal XADD to the row decoder 12, and a decoded column address signal YADD to the column decoder 13. The address decoder 32 also receives the bank address signal BADD and supplies the bank address signal BADD to the row decoder 12 and the column decoder 13.

The command terminals 22 are supplied with a command signal COM. The command signal COM may include one or more separate signals. The command signal COM input to the command terminals 22 is input to a command decoder 34 via the command input circuit 33. The command decoder 34 decodes the command signal COM to generate various internal command signals. For example, the internal commands may include a row command signal to select a word line and a column command signal, such as a read command or a write command, to select a bit line.

Although the address terminals 21 and the command terminals 22 are illustrated in FIG. 1 as being separate terminals, it should be noted that in some embodiments the address input circuit 31 and the command input circuit 33 may receive address signals ADD and command signals COM via one or more address and command terminals. That is, the address signals ADD and command signals COM in ay be provided to the semiconductor device 10 via the same terminal. For instance, the address and command terminals may provide an address signal at a falling clock edge (e.g., in synchronism with clock falling edge) and a command signal at a rising clock edge (e.g., in synchronism with clock rising edge). With this in mind, it should be understood that the description provided in the present disclosure with the separate address terminals 21 and command terminals 22 is included for discussion purposes and the techniques described herein should not be limited to using separate address terminals 21 and command terminals 22.

Accordingly, when a read command is issued and a row address and a column address are timely supplied with the read command, read data is read from a memory cell MC in the memory cell array 11 designated by these row address and column address. The read data DQ is output externally from the data terminals 24 via a read/write amplifier 15 and an input/output (IO) circuit 17. Similarly, when the write command is issued and a row address and a column address are timely supplied with the write command, and then write data DQ is supplied to the data terminals 24, the write data DQ is supplied via the input/output circuit 17 and the read/write amplifier 15 to the memory cell array 11 and written in the memory cell MC designated by the row address and the column address.

The input/output circuit 17 may include input buffers, according to one embodiment. The input/output circuit 17 receives external clock signals as a timing signal for determining input timing of write data DQ and output timing of read data DQ. Power supply potentials VDDQ and VSSQ are supplied to the input/output circuit 17. The power supply potentials VDDQ and VSSQ may be the same potentials as power supply potentials VDD and VSS that are supplied to power supply terminals 25, respectively, which will be described below. However, the dedicated power supply potentials VDDQ and VSSQ may be used for the input/output circuit 17 so that power supply noise generated by the input/output circuit 17 does not propagate to the other circuit blocks.

The power supply terminals 25 are supplied with power supply potentials VDD and VSS. These power supply potentials VDD and VSS are supplied to a bandgap circuit 40. In some embodiments the bandgap circuit 40 may be a voltage reference circuit that outputs a constant (e.g., fixed) voltage independent of power supply variations, temperature changes, circuit loading, process variations, and the like. In some embodiments, the bandgap circuit 40 may include a bandgap core circuit and a startup circuit. In alternative or additional embodiments, the bandgap circuit 40 may include the bandgap core circuit and the startup circuit may be positioned outside the bandgap circuit 40. In any case, the bandgap core circuit may output a constant voltage after being initialized by the startup circuit, as will be appreciated.

The bandgap circuit 40 may, in some embodiments, generate various internal potentials VPP, VOD, VARY, VPERI, and the like to provide to various circuit components of the semiconductor device 10. For example, the internal potential VPP may be mainly used in the row decoder 12, the internal potentials VOD and VARY may be mainly used in the sense amplifiers 18 included in the memory cell array 11, and the internal potential VPERI may be used in many other circuit blocks.

Figure 2:
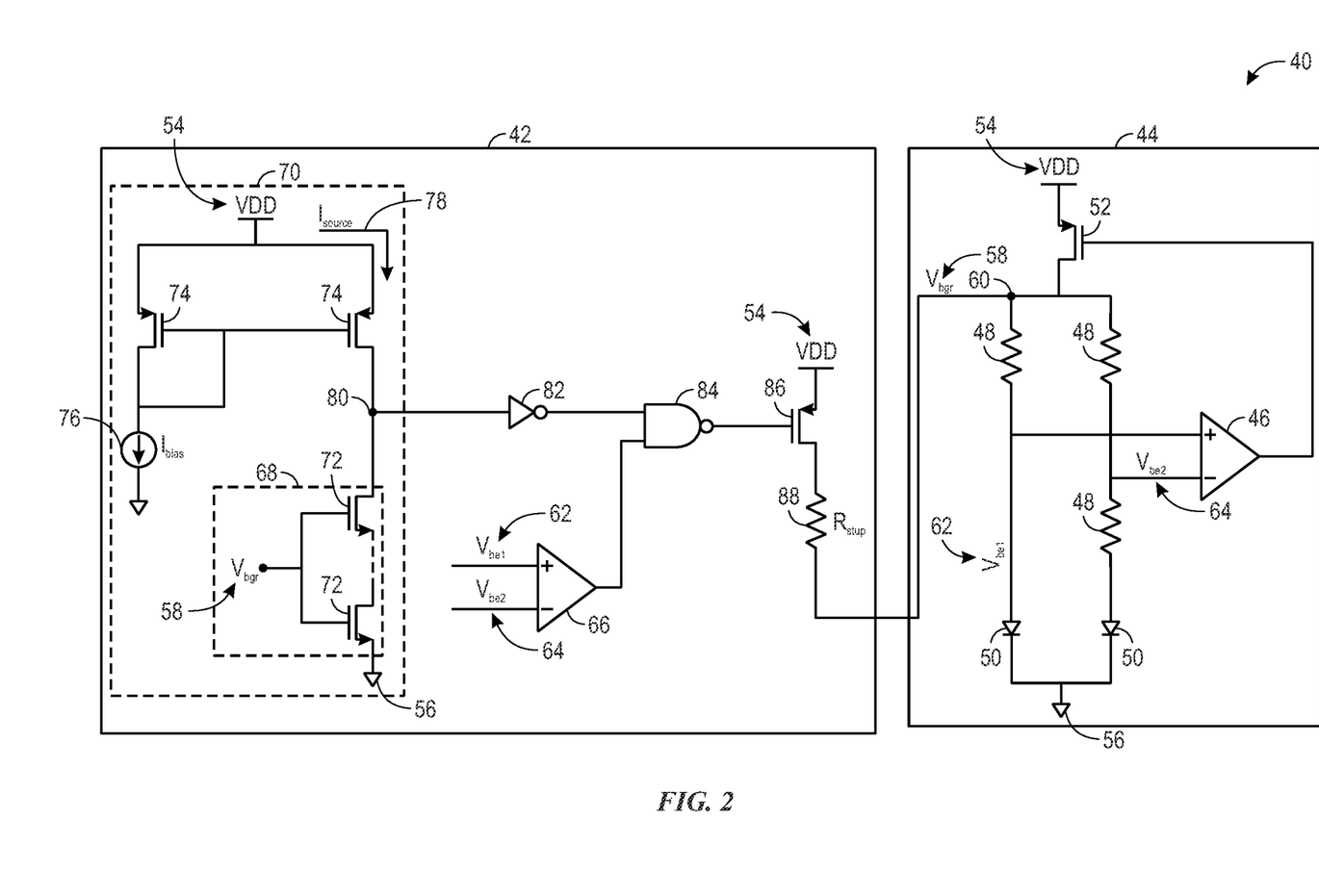
FIG. 2 is a schematic diagram illustrating a bandgap circuit having a bandgap core circuit and a startup circuit including a feedback circuit and a replica op-amp circuit that may be part of the semiconductor device of FIG. 1, according to an embodiment of the present disclosure.

By way of example, FIG. 2 illustrates a schematic diagram of the bandgap circuit 40 including a startup circuit 42 and a bandgap core circuit 44, in accordance with embodiments described herein. As shown in FIG. 2, the bandgap core circuit 44 may include a differential op-amp circuit 46, resistors 48, diodes 50, and a switch 52, coupled between a power supply potential VDD or voltage source VDD 54 and a ground connection 56. Although the voltage source VDD 54 is described as the power supply potential VDD herein, it should be appreciated that in alternative or additional embodiments, different voltage sources may be used in each of the voltage sources of the described embodiments. In any case, after an initialization period of the bandgap circuit 40, the bandgap core circuit 44 may produce an output voltage $V_{bgr}$ 58, which may be a constant voltage.

As discussed above, the startup circuit 42 may assist the bandgap core circuit 44 to initialize and produce the output voltage $V_{bgr}$ 58 at a node 60 during an initialization period of the bandgap circuit 40. That is, the startup circuit 42 may ramp up the output voltage $V_{bgr}$ 58 of the bandgap core circuit 44 to operate in a steady state using a desired voltage value. After ramping up the output voltage $V_{bgr}$ 58 to the desired voltage value, the startup circuit 42 may disconnect from the bandgap core circuit 44. Subsequently, the differential op-amp circuit 46 may keep the switch 52 of the bandgap core circuit 44 in a closed state (connected) to keep the output voltage $V_{bgr}$ 58 at the desired voltage value. As such, the bandgap core circuit 44 may generate a first local voltage $V_{be1}$ 62 and a second local voltage $V_{be2}$ 64 based on the output voltage $V_{bgr}$ 58 in a self-biased manner.

That said, the differential op-amp circuit 46 may include a number of switches, including, for example, any suitable transistor-type switch such as a bipolar junction transistor, a field-effect transistor, and the like. Each of the switches of the differential op-amp circuit 46 may be susceptible to different process variations such as temperature and voltage variations. As such, in the depicted embodiment, the startup circuit 42 may include a replica op-amp circuit 66 of the differential op-amp circuit 46 (e.g., a comparator circuit) to reproduce the process variations of the differential op-amp circuit 46 in the startup circuit 42. In specific embodiments, the replica op-amp circuit 66 may be a scaled-down replica of the differential op-amp circuit 46 to reduce current consumption of the startup circuit 42 and the size of the startup circuit 42. However, it should be noted that in different embodiments, the replica op-amp circuit 66 may undertake any suitable size.

Moreover, to further ensure that the output voltage $V_{bgr}$ 58 is ramped up to the desired voltage value, the startup circuit 42 may also include a feedback circuit 68 integrated as part of a current mirror circuit 70. The feedback circuit 68 may couple between a branch of the current mirror circuit 70 of the startup circuit 42 and the node 60 of the bandgap core circuit 44 associated with the output voltage $V_{bgr}$ 58. In the depicted embodiment, the output voltage $V_{bgr}$ 58 is provided to a gate input of switches 72 of the feedback circuit 68. The switches 72 of the feedback circuit 68 may connect or disconnect the branch of the current mirror circuit 70 based on the output voltage $V_{bgr}$ 58. Although two switches 72 are shown in FIG. 2, any number of switches 72 may be used in alternative or different embodiments. That said, the output signals from the replica op-amp circuit 66 and the current mirror circuit 70 may cause connecting or disconnecting the voltage source VDD 54 and the bandgap core circuit 44 to ramp up the output voltage $V_{bgr}$ 58 to the desired voltage value.

With the foregoing in mind, the initialization process of the bandgap circuit 40 is described herein. The current mirror circuit 70 of the startup circuit 42 may include switches 74 to generate a reference current ($I_{bias}$) 76. At the beginning of the initialization process, the output voltage $I_{bgr}$ 58 is at ground voltage (e.g., zero reference voltage) and the switches 72 of the feedback circuit 68 are in an open state (disconnected). In one example, the switches 72 of the feedback circuit 68 may be N-type switches and the output voltage $V_{bgr}$ 58 may be coupled to a gate input of the switches 72.

As such, a source current ($I_{source}$) 78 may be blocked from flowing through the switches 72 of the feedback circuit 68. Accordingly, a voltage of a node 80 between the voltage source VDD 54 of the current mirror circuit 70 and the switches 72 of the feedback circuit 68 may be equal to VDD. Moreover, the node 80 may also be coupled to an input of an invertor 82. Accordingly, in response to the high voltage (e.g., VDD) of the node 80 during the initialization of the bandgap circuit 40, the invertor 82 may output a logic 0 to an input of an AND gate 84. The logic 0 input to the AND gate 84 ensures a logic 0 output from the AND gate 84.

The output of the AND gate 84 may be coupled to a gate input of a P-type switch 86. Moreover, the P-type switch 86 may be coupled between the voltage source VDD 54 and the bandgap core circuit 44. Accordingly, during the initialization of the bandgap circuit 40, the P-type switch 86 may be in a closed state to connect the voltage source VDD 54 and the bandgap core circuit 44 based on the logic 0 output of the AND gate 84. As such, the voltage source VDD 54 and the node 60 of the bandgap core circuit 44 may be connected to ramp up the output voltage $V_{bgr}$ 58 to the desired voltage value. In the depicted embodiment, a resistor ($R_{stup}$) 88 is coupled between the P-type switch 86 and the bandgap core circuit 44 representing a resistance of the bandgap core circuit 44 seen from the startup circuit 42.

When the output voltage $V_{bgr}$ 58 reaches the desired voltage value, the startup circuit 42 may disconnect from the bandgap core circuit 44 by opening the P-type switch 86 (switching to open state). To open the P-type switch 86, the AND gate 84 may provide a logic 1 value to the gate input of the P-type switch 86. As such, the replica op-amp circuit 66 and the invertor 82 may both output a logic 1.

The replica op-amp circuit 66 may receive and compare the first local voltage $V_{be1}$ 62 and the second local voltage $V_{be2}$ 64 of the bandgap core circuit 44. The replica op-amp circuit 66 may output a logic 1 to the AND gate 84 when a voltage difference between the first local voltage $V_{be1}$ 62 and the second local voltage $V_{be2}$ 64 rises to a sufficient voltage level, based on the output voltage $V_{bgr}$ 58 rising to the desired voltage value. For example, the voltage of the first local voltage $V_{be1}$ 62 and the second local voltage $V_{be2}$ 64 may each rise separately according to a resistance value of the each of the resistors 48 and the diodes 50 and based on the output voltage $V_{bgr}$ 58.

Moreover, the switches 72 of the feedback circuit 68 may close (switch to the closed state) when the output voltage $V_{bgr}$ 58 reaches the desired voltage value. In some embodiment, the switches 72 of the feedback circuit 68 may sufficiently close when the output voltage $V_{bgr}$ 58 reaches the desired voltage value based on gradual increase in conductance of the switches 72 (e.g., when using transistors). In different embodiments, the switches 72 of the feedback circuit 68 may switch to the closed state when the output voltage $V_{bgr}$ 58 reaches the desired voltage value (e.g., when using MOSFETs).

As such, the voltage source VDD 54 may become connected to the ground connection 56 of the current mirror circuit 70 causing the $I_{source}$ 78 to mirror the $I_{bias}$ 76 and flow through the switches 72 of the feedback circuit 68 to the ground connection 56. As such, the voltage of the node 80 may be reduced below a logic 1 threshold value (e.g., to ground voltage level). Subsequently, the invertor 82 may output a logic 1 to the AND gate 84. In this manner, the startup circuit 42 may ensure that the output voltage $V_{bgr}$ 58, the first local voltage $V_{be1}$ 62, and the second local voltage $V_{be2}$ 64 are at sufficient voltage levels before disconnecting from the bandgap core circuit 44 (switching off).

Although the startup circuit 42 is described with respect to certain circuit components, it should be appreciated that other viable circuit components may be used for integrating the output voltage $V_{bgr}$ 58 (in a feedback function) and the effect of process variations of the differential op-amp circuit 46 with the startup circuit. For example, in different embodiments, the switches 72, the invertor 82, the AND gate 84, and the P-type switch 86, may be replaced with other viable circuit components. Moreover, fewer or more circuit components may be used using different schematics to integrate the output voltage $V_{b}$g 58 and the differential op-amp circuit 46 with the startup circuit 42.

Figure 3:
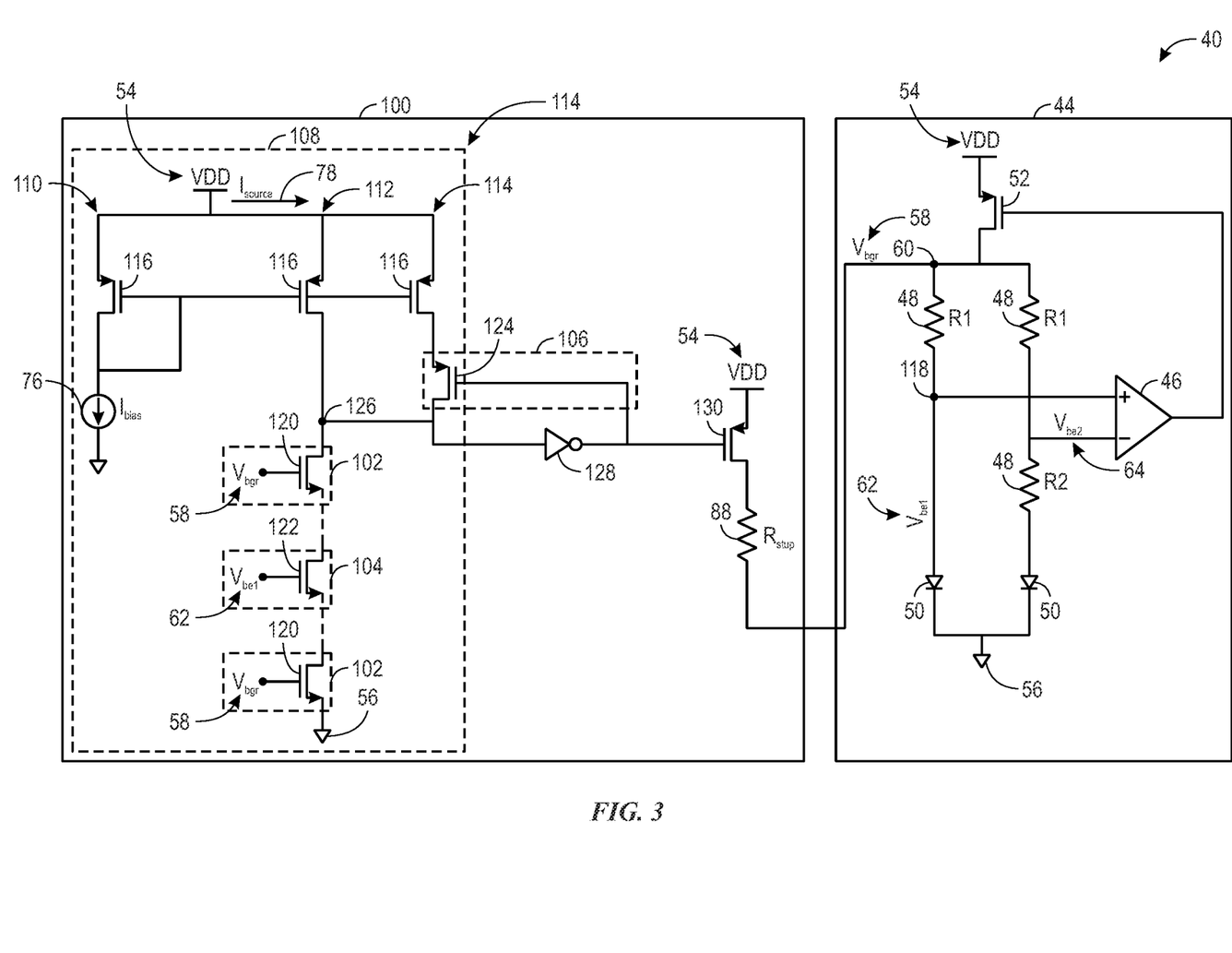
FIG. 3 is a schematic diagram illustrating a bandgap circuit having a bandgap core circuit and a startup circuit including a feedback circuit, a comparator circuit, and a hysteresis circuit that may be part of the semiconductor device of FIG. 1, according to an embodiment of the present disclosure.

Referring now to FIG. 3, a schematic diagram of the bandgap circuit 40 including the bandgap core circuit 44 and a startup circuit 100 is illustrated, in accordance with embodiments described herein. In some embodiments, the bandgap core circuit 44 of FIG. 3 may be similar to the bandgap core circuit 44 of FIG. 2 described above. However, in alternative or additional embodiments, a bandgap core circuit with different schematics may also be used with the bandgap circuit 40 and the startup circuit 100.

The startup circuit 100 may include a feedback circuit 102, a comparator circuit 104, and a hysteresis circuit 106, integrated with a current mirror circuit 108. The startup circuit 100 may ensure the output voltage $V_{bgr}$ 58 is at the desired voltage value and the first local voltage $V_{be1}$ 62 is at sufficient voltage level before switching off and disconnecting from the bandgap core circuit 44. The current mirror circuit 108 may include three branches, a current reference branch (first branch) 110, a second branch 112, and a third branch 114. The current reference branch 110, the second branch 112, and the third branch 114 may each include a switch 116 of the current mirror circuit 108 disposed thereon.

The current reference branch 110 may generate the $I_{bias}$ 76. Based on the architecture of the current mirror circuit 108, the $I_{bias}$ 76 may be mirrored in similar or different proportions between the second branch 112 and the third branch 114. That is, the cumulative current through the second branch 112 and the third branch 114 may equal (e.g., mirror) the $I_{bias}$ 76 or the $I_{source}$ 78.

That said, the second branch 112 and the third branch 114 may couple the switches 120 of the feedback circuit 102 coupled to the node 60 associated with the output voltage $V_{bgr}$ 58 and the switch 122 of the comparator circuit 104 coupled to a node 118 associated with the first local voltage $V_{be1}$. The third branch 114 may also include a switch 124 of the hysteresis circuit 106 that is coupled to an output of the current mirror circuit 108, as will be appreciated. An open state of each of the switches 120 of the feedback circuit 102 or the switch 122 of the comparator circuit 104 may prevent current flow through the second branch 112 and the third branch 114. Moreover, an open state of the switch 124 of the hysteresis circuit 106 may prevent current flow through the third branch 114.

In any case, a portion of the $I_{bias}$ 76 may flow, in similar or different proportions, through the second branch 112 and the third branch 114 to the ground connection 56 when the switches 120 of the feedback circuit 102, the switch 122 of the comparator circuit 104, and the switch 124 of the hysteresis circuit 106 are in a closed state. The feedback circuit 102 and the comparator circuit 104 may enable the startup circuit 100 and the bandgap core circuit 44 to operate in conjunction with each other based on feeding back the output voltage $V_{bgr}$ 58 and the first local voltage $V_{be1}$ of the bandgap core circuit 44 to the startup circuit 100. Accordingly, initialization of the output voltage $V_{bgr}$ 58 may be less susceptible to variations of process, temperature, and voltage, among other variables. Moreover, incorporation of the hysteresis circuit 106 may reduce undesired oscillations when initializing the bandgap circuit 40.

Although two switches 120 of the feedback circuit 102 are shown in FIG. 3, any number of switches 120 may be used with the feedback circuit 102. Moreover, the switch 122 of the comparator circuit 104 may be positioned in between, above, or below the switches 120 of the feedback circuit 102. In alternative or additional embodiments, the comparator circuit 104 may also include different number of switches 122.

With the foregoing in mind, the initialization process of the bandgap circuit 40 is described herein. As mentioned above, the current reference branch 110 of the startup circuit 100 may generate the $I_{bias}$ 76. At the beginning of the initialization process, the output voltage $V_{bgr}$ 58 is at ground voltage (e.g., zero reference voltage). As such, the switches 120 of the feedback circuit 102 and the switch 122 of the comparator circuit 104 are in open state. In one example, the switches 120 of the feedback circuit 102 and the switch 122 of the comparator circuit 104 may be N-type switches.

As such, the $I_{source}$ 78 may be blocked from flowing through the second branch 112 and the third branch 114 of the current mirror circuit 108. Accordingly, a voltage of a node 126 between the voltage source VDD 54 and the switches 120 of the feedback circuit 102 and the switch 122 of the comparator circuit 104 may equal to VDD. The node 126 may also be coupled to an input of an invertor 128. Accordingly, in response to the high voltage (e.g., VDD) of the node 126, the invertor 128 may output a logic 0 to an input of a P-type switch 130.

The P-type switch 130 may be coupled between the voltage source VDD 54 and the bandgap core circuit 44. In the depicted embodiment, a resistor ($R_{stup}$) 88 is coupled between the P-type switch 130 and the bandgap core circuit 44 representing a resistance of the bandgap core circuit 44 seen from the startup circuit 100. Accordingly, at the beginning of the initialization process, the P-type switch 130 may be at a closed state connecting the voltage source VDD 54 and the bandgap core circuit 44 to ramp up the output voltage $V_{bgr}$ 58 to the desired voltage value.

In different embodiments, the switches 120 of the feedback circuit 102 and the switch 122 of the comparator circuit 104 may each be implemented using different switching technology. For example, each of the switches 120 or 122 may be implemented using transistors that may switch to close (or open) gradually or using MOSFETs that may flip to close (or open) rapidly. In any case, the switches 120 of the feedback circuit 102 may switch to the closed state as the output voltage $V_{bgr}$ 58 is ramping up to the desired voltage value. Moreover, the switch 122 of the comparator circuit 104 may switch to the closed state when the first local voltage $V_{be1}$ 62 is ramped up to a sufficient level (e.g., a threshold voltage), based on the output voltage $V_{bgr}$ 58, the resistors 48 and the diodes 50.

Furthermore, when the switches 120 of the feedback circuit 102 and the switch 122 of the comparator circuit 104 are in a closed state, electric current may flow through switches 120 of the feedback circuit 102 and the switch 122 of the comparator circuit 104 to the ground connection 56. Subsequently, voltage on the node 126 may drop below a logic 1 threshold value and the output of the invertor 128 may flip to logic 1. Based on the output from the invertor 128 being logic 1, the switch 124 of the hysteresis circuit 106 and the P-type switch 130 may flip to an open state.

Opening the switch 124 of the hysteresis circuit 106 may prevent current flow through the third branch 114 of the current mirror circuit 108. Moreover, as mentioned above, a portion of the $I_{source}$ 78 may flow through the second branch 112 of the current mirror circuit 108. Accordingly, when the hysteresis circuit 106 prevents current flow through the third branch 114, the startup circuit 100 may sink the portion of the $I_{source}$ 78 flowing through the second branch 112 to the ground connection 56. As such, less current will be grounded when the output voltage $V_{bgr}$ 58 is ramped up to the desired voltage value and the first local voltage $V_{be1}$ 62 is ramped up to the sufficient voltage level. Accordingly, the startup circuit 100 may experience lower levels of oscillation due to flipping the P-type switch 130. Moreover, the initialization process of the bandgap circuit 40 may be performed using less time due to faster switch off time of the startup circuit 100.

After the initialization process, as described above, the bandgap core circuit 44 may generate the output voltage $V_{bgr}$ 58 in a self-biased manner. That is, when the output voltage $V_{bgr}$ 58 is ramped up to the desired voltage value, the differential op-amp circuit 46 may provide a logic 1 signal to the switch 52 to ensure the bandgap core circuit 44 may continue to generate the output voltage $V_{bgr}$ 58 in a self-biased manner.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A startup circuit, comprising:
 a current mirror circuit comprising:
  a current reference branch coupled to a source voltage and a ground connection configured to generate a reference current;
  a second branch coupled to the source voltage and a first node configured to conduct a second current that is a first portion of the reference current; and
  a third branch coupled to the source voltage and the first node configured to conduct a third current that is a second portion of the reference current;
 a first feedback switch coupled to the first node and the ground connection, wherein a gate of the first feedback switch is coupled to a voltage output node of a bandgap core circuit; and
 a first comparator switch coupled to the first node and the ground connection, wherein a gate of the first comparator switch is coupled to a first local voltage node of the bandgap core circuit;
 wherein the startup circuit is configured to:
  couple the source voltage to the voltage output node of the bandgap core circuit based on the first node having a first voltage; and
  decouple the source voltage from the voltage output node of the bandgap core circuit based on the first node having a second voltage.

2. The startup circuit of claim 1, comprising a switch coupled to the source voltage and the voltage output node of the bandgap core circuit configured to couple and decouple the source voltage from the voltage output node of the bandgap core circuit.

3. The startup circuit of claim 2, wherein a gate of the switch is configured to couple to the first node via an inverter circuit.

4. The startup circuit of claim 1, wherein the startup circuit is configured to couple the source voltage to the voltage output node of the bandgap core circuit to ramp up a voltage of the voltage output node to a first threshold.

5. The startup circuit of claim 4, wherein the startup circuit is configured to decouple the source voltage from the voltage output node of the bandgap core circuit when the voltage of the voltage output node of the bandgap core circuit reaches the first threshold.

6. The startup circuit of claim 5, wherein the startup circuit is configured to determine whether the voltage output node of the bandgap core circuit reaches the first threshold based on operations of the first feedback switch and the first comparator switch.

7. The startup circuit of claim 1, wherein the first feedback switch is configured to:
 decouple the first node from the ground connection when a voltage of the voltage output node is below a first threshold voltage; and
 couple the first node to the ground connection when the voltage of the voltage output node is equal to or greater than the first threshold voltage.

8. The startup circuit of claim 1, wherein the first comparator switch is configured to:
 decouple the first node from the ground connection when a voltage of the first local voltage node is below a second threshold voltage; and
 couple the first node to the ground connection when the voltage of the first local voltage node is equal to or greater than the second threshold voltage.

9. The startup circuit of claim 1, comprising a second feedback switch coupled to the first node and the ground connection, wherein a gate of the second feedback switch is coupled to the voltage output node of the bandgap core circuit.

10. The startup circuit of claim 1, wherein the third branch comprises a hysteresis switch, wherein the hysteresis switch is configured to:
 couple the source voltage to the first node on the third branch based on the first node having the first voltage; and
 decouple the source voltage from the first node on the third branch based on the first node having the second voltage.

11. A bandgap circuit comprising:
 a bandgap core circuit configured to output a reference voltage; and
 a startup circuit comprising:
  a current mirror circuit comprising:
   a current reference branch coupled to a source voltage and a ground connection configured to generate a reference current;
   a second branch coupled to the source voltage and a first node configured to conduct a second current that is a first portion of the reference current; and
   a third branch coupled to the source voltage and the first node configured to conduct a third current that is a second portion of the reference current;
  a first feedback switch coupled to the first node and the ground connection, wherein a gate of the first feedback switch is coupled to the bandgap core circuit, wherein the gate of the first feedback switch is configured to receive the reference voltage; and
  a first comparator switch coupled to the first node and the ground connection, wherein a gate of the first comparator switch is coupled to a first local voltage node of the bandgap core circuit;
  wherein the startup circuit is configured to:
   couple the source voltage to the bandgap core circuit based on the first node having a first voltage; and
   decouple the source voltage from the bandgap core circuit based on the first node having a second voltage.

12. The bandgap circuit of claim 11, comprising a switch coupled to the source voltage and the bandgap core circuit configured to couple and decouple the source voltage from the bandgap core circuit.

13. The bandgap circuit of claim 12, wherein a gate of the switch is configured to couple to the first node via an inverter circuit.

14. The bandgap circuit of claim 11, wherein the startup circuit is configured to couple the source voltage to the bandgap core circuit to ramp up a voltage value of the reference voltage of the bandgap core circuit to a first threshold.

15. The bandgap circuit of claim 14, wherein the startup circuit is configured to decouple the source voltage from the bandgap core circuit when the voltage value of the reference voltage reaches the first threshold.

16. The bandgap circuit of claim 15, wherein the startup circuit is configured to determine whether the voltage value of the reference voltage reaches the first threshold based on operations of the first feedback switch and the first comparator switch.

17. The bandgap circuit of claim 11, wherein the first feedback switch is configured to:
- decouple the first node from the ground connection when a voltage value of reference voltage is below a first threshold voltage; and
- couple the first node to the ground connection when the voltage value of the reference voltage is equal to or greater than the first threshold voltage.

18. The bandgap circuit of claim 11, wherein the first comparator switch is configured to:
- decouple the first node from the ground connection when a voltage of the first local voltage node is below a second threshold voltage; and
- couple the first node to the ground connection when the voltage of the first local voltage node is equal to or greater than the second threshold voltage.

19. The bandgap circuit of claim 11, comprising a second feedback switch coupled to the first node and the ground connection, wherein a gate of the second feedback switch is coupled to the bandgap core circuit.

20. The bandgap circuit of claim 11, wherein the third branch comprises a hysteresis switch, wherein the hysteresis switch is configured to:
- couple the source voltage to the first node on the third branch based on the first node having the first voltage; and
- decouple the source voltage from the first node on the third branch based on the first node having the second voltage.

* * * * *